US007247947B2

(12) United States Patent
Wakabayashi et al.

(10) Patent No.: US 7,247,947 B2
(45) Date of Patent: Jul. 24, 2007

(54) SEMICONDUCTOR DEVICE COMPRISING A PLURALITY OF SEMICONDUCTOR CONSTRUCTS

(75) Inventors: Takeshi Wakabayashi, Sayama (JP); Ichiro Mihara, Tachikawa (JP)

(73) Assignee: Casio Computer Co., Ltd., Tokyo (JP)

(*) Notice: Subject to any disclaimer, the term of this patent is extended or adjusted under 35 U.S.C. 154(b) by 0 days.

(21) Appl. No.: 11/524,481

(22) Filed: Sep. 20, 2006

(65) Prior Publication Data

US 2007/0069272 A1 Mar. 29, 2007

(30) Foreign Application Priority Data

Sep. 26, 2005 (JP) ............................ 2005-277046

(51) Int. Cl.
*H01L 23/12* (2006.01)
*H01L 23/48* (2006.01)
*H01L 23/52* (2006.01)
*H01L 29/40* (2006.01)

(52) U.S. Cl. ...................... 257/758; 257/759; 257/760; 257/734; 257/736; 257/E23.019; 257/E23.041; 257/E23.145; 257/E21.627; 257/E21.641

(58) Field of Classification Search .................... None
See application file for complete search history.

(56) References Cited

U.S. PATENT DOCUMENTS

| | | | | |
|---|---|---|---|---|
| 6,882,054 | B2 * | 4/2005 | Jobetto | 257/759 |
| 7,030,494 | B2 * | 4/2006 | Aoki | 257/758 |
| 7,064,440 | B2 * | 6/2006 | Jobetto et al. | 257/758 |
| 7,075,181 | B2 * | 7/2006 | Wakabayashi et al. | 257/734 |
| 7,183,639 | B2 * | 2/2007 | Mihara et al. | 257/690 |
| 2004/0262716 | A1 * | 12/2004 | Aoki | 257/619 |
| 2005/0098891 | A1 * | 5/2005 | Wakabayashi et al. | 257/758 |
| 2005/0200018 | A1 * | 9/2005 | Wakisaka et al. | 257/738 |
| 2005/0269698 | A1 * | 12/2005 | Okada et al. | 257/737 |

FOREIGN PATENT DOCUMENTS

JP 2005-142466 A 6/2005

* cited by examiner

*Primary Examiner*—Jasmine Clark
(74) *Attorney, Agent, or Firm*—Frishauf, Holtz, Goodman & Chick, P.C.

(57) ABSTRACT

A semiconductor device includes a first semiconductor construct provided on a base plate and having a semiconductor substrate and external connection electrodes. An insulating layer is provided on the base plate around the first semiconductor construct. An upper layer insulating film is provided on the first semiconductor construct and insulating layer. Upper layer wiring lines are provided on the upper layer insulating film so that the upper layer wiring line is electrically connected to the external connection electrode. A second semiconductor construct is joined to and installed on connection pad portions. All jointing portions of the second semiconductor construct for the connection pad portions of the upper layer wiring lines are disposed in a region corresponding to the first semiconductor construct.

9 Claims, 2 Drawing Sheets

26
22
37
37a
37b
38
21
1
33
31
32
36
29
28
34
35
2b
54
56
57
53
55
52
51
3
4
8
6
13
12
11
10
9
7
5
2a
35
41
44
43
23
25
24
42
2
28
27
29

SEMICONDUCTOR DEVICE COMPRISING A PLURALITY OF SEMICONDUCTOR CONSTRUCTS

CROSS-REFERENCE TO RELATED APPLICATIONS

This application is based upon and claims the benefit of priority from prior Japanese Patent Application No. 2005-277046, filed Sep. 26, 2005, the entire contents of which are incorporated herein by reference.

BACKGROUND OF THE INVENTION

1. Field of the Invention

This invention relates to a semiconductor device having a plurality of semiconductor constructs.

2. Description of the Related Art

There is a conventional multi-type semiconductor device, wherein a first semiconductor construct having columnar electrodes on a semiconductor substrate is disposed on the upper surface of a base plate having a planar size larger than that of the first semiconductor construct; an insulating layer is provided in a part of the upper surface of the base plate on the periphery of the first semiconductor construct; an upper layer insulating film is provided on the first semiconductor construct and the insulating layer; upper layer wiring lines are provided on the upper layer insulating film so that the upper layer wiring lines are electrically connected to the columnar electrodes of the first semiconductor construct; a solder ball is provided on a connection pad portion of the upper layer wiring line; lower layer wiring lines are provided on the lower surface of the base plate so that the lower layer wiring lines are electrically connected to the upper layer wiring lines via vertical conducting portions; and a second semiconductor construct having a semiconductor substrate is installed under a connection pad portion of the lower layer wiring line (e.g., refer to Jpn. Pat. Appln. KOKAI Publication No. 2005-142466).

In the conventional semiconductor device, in order to effectively utilize substantially the whole area of the lower surface of the base plate, one part of the connection pad portion of the lower layer wiring line is disposed in a part of the lower surface of the base plate corresponding to the inner side of a region where the first semiconductor construct is disposed, and the other part thereof is disposed in a part of the lower surface of the base plate corresponding to the outer side of the region where the first semiconductor construct is disposed, and then solder balls provided on the semiconductor substrate of the second semiconductor construct are joined to the lower surfaces of the connection pad portions of the lower layer wiring lines.

In the conventional semiconductor device, one part of the junction portion of the second semiconductor construct for the connection pad portions of the lower layer wiring lines are disposed at a position corresponding to the semiconductor substrate of the first semiconductor construct, and the other part thereof is disposed at a position corresponding to the insulating layer provided on the periphery of the first semiconductor construct, such that there is a problem that the other part of the junction portion of the second semiconductor construct, especially, might be damaged due to thermal stress caused from a difference of thermal expansion coefficients between the semiconductor substrate (silicon) of the second semiconductor construct and the insulating layer (resin).

BRIEF SUMMARY OF THE INVENTION

It is therefore an object of this invention to provide a semiconductor device capable of preventing damage due to thermal stress in junction portions of second semiconductor constructs.

According to an aspect of the invention there is provided a semiconductor device comprising:

a base plate;

a first semiconductor construct provided on an upper surface of the base plate and having a semiconductor substrate and a plurality of external connection electrodes provided on the semiconductor substrate;

an insulating layer provided on the base plate around the first semiconductor construct;

an upper layer insulating film provided on the first semiconductor construct and the insulating layer;

a plurality of upper layer wiring lines provided on the upper layer insulating film so that the upper layer wiring line is electrically connected to the external connection electrode of the first semiconductor construct; and at least one second semiconductor construct having jointing portions joined to connection pad portions of the upper layer wiring lines, wherein all the jointing portions of the second semiconductor construct for the connection pad portions of the upper layer wiring lines are disposed in a region corresponding to the first semiconductor construct.

According to this invention, all the jointing or junction portions of the second semiconductor constructs are disposed in the region corresponding to the first semiconductor construct, such that thermal expansion and contraction of the insulating layer provided on the periphery of the first semiconductor construct do not have an adverse effect on the junction portions of the second semiconductor constructs, and a difference of thermal expansion coefficients between the second semiconductor constructs and the first semiconductor construct can be narrowed down, and moreover, the damage due to the thermal stress in the junction portions of the second semiconductor constructs can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
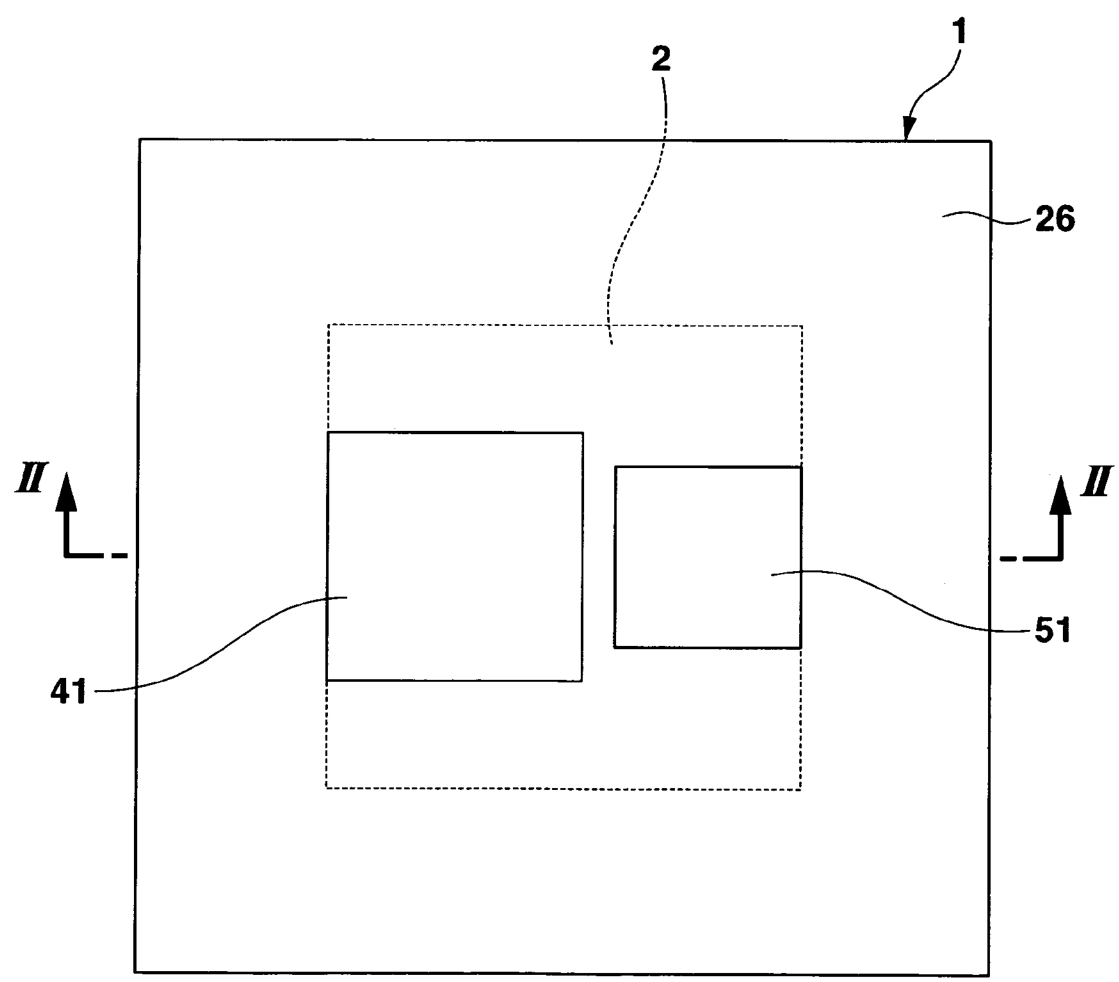
FIG. 1 is a plan view of a semiconductor device as one embodiment of this invention.
Figure 2:
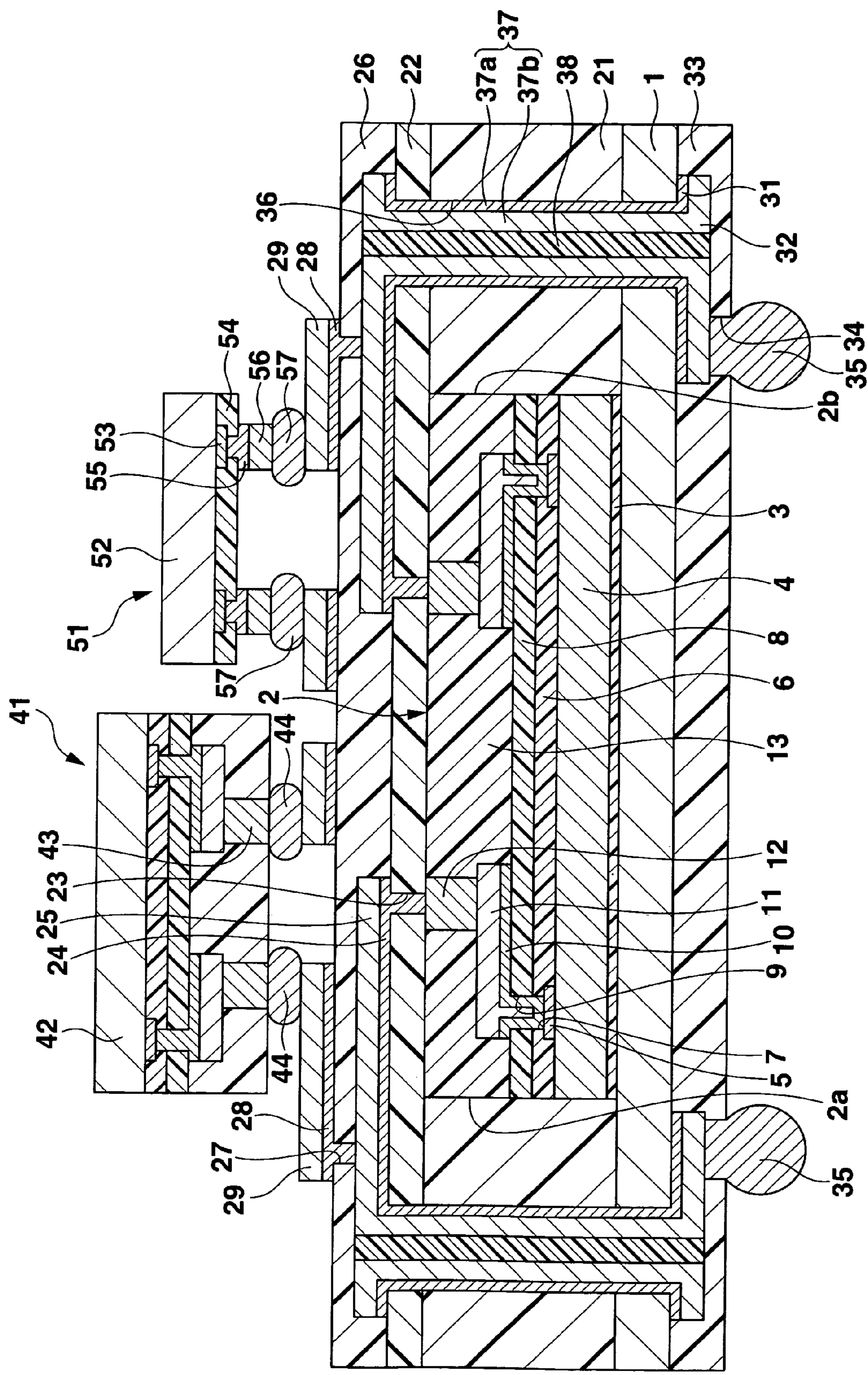
FIG. 2 is an enlarged sectional view along the II-II line in FIG. 1.

FIG. 1 is a plan view of a semiconductor device as one embodiment of this invention, and FIG. 2 is a sectional view substantially along the II-II line in FIG. 1. This semiconductor device includes a planar square base plate 1 made of, for example, a glass fabric based epoxy resin. The lower surface of a planar square first semiconductor construct 2 having a planar size somewhat smaller than the that of the base plate 1 is bonded to the center of the upper surface of the base plate 1 via a bonding layer 3 made of a die bond material.

The first semiconductor construct 2 is generally called a chip size package (CSP), and includes a silicon substrate (semiconductor substrate) 4. The lower surface of the silicon substrate 4 is bonded to the upper surface of the base plate 1 via the bonding layer 3. An integrated circuit (not shown) having a predetermined function is provided on the upper surface of the silicon substrate 4, and a plurality of connection pads 5 made of, for example, an aluminum-based metal are provided on a peripheral portion of the upper surface so that the connection pads 5 are electrically connected to the integrated circuit.

An insulating film 6 made of, for example, silicon oxide is provided on the upper surface of the silicon substrate 4 and the connection pads 5 except for the centers thereof in which the center of each of the connection pads 5 is exposed via an opening 7 formed in the insulating film 6. A protective film 8 made of, for example, a polyimide-based resin is provided on the upper surface of the insulating film 6. In this case, an opening 9 is provided in the protective film 8 in a part corresponding to the opening 7 of the insulating film 6.

A foundation metal layer 10 made of, for example, copper is provided on the upper surface of the protective film 8. A wiring line 11 made of copper is provided on the entire upper surface of the foundation metal layer 10. One end of the wiring line 11 including the foundation metal layer 10 is electrically connected to the connection pad 5 via the openings 9 and 7 of the protective film 8 and the insulating film 6. A columnar electrode (external connection electrode) 12 made of copper is provided on the upper surface of a connection pad portion of the wiring line 11. A sealing film 13 made of, for example, an epoxy-based resin is provided between the columnar electrodes 12 on the upper surfaces of the wiring lines 11 and on the upper surface of the protective film 8 so that the upper surface of the sealing film 13 may be flush with the upper surfaces of the columnar electrodes 12.

A rectangular frame-shaped insulating layer 21 is provided on the upper surface of the base plate 1 at the periphery of the first semiconductor construct 2. The insulating layer 21 is, for example, made of a reinforcing material including an inorganic material such as a silica filler dispersed into a thermosetting resin such as an epoxy-based resin or a polyimide-based resin, or only made of a thermosetting resin such as an epoxy-based resin.

A first upper layer insulating film 22 is provided on the upper surfaces of the first semiconductor construct 2 and the insulating layer 21 so that the upper surface of the first upper layer insulating film 22 is flat. The first upper layer insulating film 22 is, for example, made of a thermosetting resin such as an epoxy-based resin or a polyimide-based resin impregnated into a base material including, for example, glass fabric or glass fiber, or only made of a thermosetting resin such as an epoxy-based resin.

An opening 23 is formed in the first upper layer insulating film 22 in a part corresponding to the center of the upper surface of the columnar electrode 12 of the first semiconductor construct 2. A first upper layer foundation metal layer 24 made of, for example, copper is provided on the upper surface of the first upper layer insulating film 22. A first upper layer wiring line 25 made of copper is provided on the entire upper surface of the first upper layer foundation metal layer 24. One end of the first upper layer wiring line 25 including the first upper layer foundation metal layer 24 is electrically and mechanically connected to the upper surface of the columnar electrode 12 of the first semiconductor construct 2 via the opening 23 formed in the first upper layer insulating film 22.

A second upper layer insulating film 26 made of the same material as that of the first upper layer insulating film 22 is provided on the upper surfaces of the first upper layer wiring line 25 and the first upper layer insulating film 22. An opening 27 is formed in the second upper layer insulating film 26 in a part corresponding to at least part of a connection pad portion of the first upper layer wiring line 25.

Second upper layer foundation metal layers 28 made of, for example, copper are provided on the upper surface of the second upper layer insulating film 26. A second upper layer wiring line 29 made of copper is mounted on the entire upper surface of the second upper layer foundation metal layer 28. One end of at least part of the second upper layer wiring line 29 including the second upper layer foundation metal layer 28 is electrically connected to the connection pad portion of the first upper layer wiring line 25 via the opening 27 of the second upper layer insulating film 26.

Lower layer foundation metal layers 31 made of, for example, copper are provided on the lower surface of the base plate 1. A lower layer wiring line 32 made of copper is attached on the entire lower surface of the lower layer foundation metal layer 31. A lower layer insulating film 33 made of, for example, a solder resist is provided on the lower surfaces of the lower layer wiring line 32 and the base plate 1. An opening 34 is formed in the lower layer insulating film 33 in a part corresponding to a connection pad portion of the lower layer wiring line 32. A solder ball 35 is provided in and under the opening 34 so that the solder ball 35 is electrically connected to the connection pad portion of the lower layer wiring line 32.

The first upper layer wiring line 25 including the first upper layer foundation metal layer 24 is electrically connected to the lower layer wiring line 32 including the lower layer foundation metal layer 31 via a vertically extending conducting portion 37. The conducting portion 37 includes a foundation metal layer or outer layer 37*a* made of metal, for example, copper and a copper layer or inner layer 37*b*, and is provided on an inner wall surface of a vertical through-hole 36 provided at predetermined places through the first upper layer insulating film 22, the insulating layer 21 and the base plate 1. A filling material 38 made of, for example, a solder resist is filled in a vertical or control hole of the vertical conducting portion 37.

Two second semiconductor constructs 41 and 51 are installed on connection pad portions of the second upper layer wiring lines 29. One second semiconductor construct 41 has the same basic configuration as the first semiconductor construct 2 and has a planar square shape. However, this second semiconductor construct 41 is different from the first semiconductor construct 2 in that it has a size smaller than that of the first semiconductor construct 2 and in that it has solder balls 44 provided on the lower surfaces of columnar electrodes 43 provided under a silicon substrate (semiconductor substrate) 42. This second semiconductor construct 41 is installed on the connection pad portion of the second upper layer wiring line 29 in a condition where its solder balls 44 are joined to the upper surfaces of the connection pad portions of the second upper layer wiring lines 29.

The other second semiconductor construct 51 is generally called a bare chip, wherein a plurality of connection pads 53 is provided on a peripheral portion of the lower surface of a silicon substrate (semiconductor substrate) 52, and an insulating film 54 made of, for example, silicon oxide is provided on the lower surfaces the connection pads of the connection pads 53 except for the centers thereof and on the lower surface of the silicon substrate 52. Foundation metal layers 55 made of, for example, copper and lower surface connection pads 56 made of copper are provided on the lower surface of the insulating film 54 so that the connection pads 53, 56 are electrically connected the metal layer 55. A solder ball 57 is provided on the lower surface of the lower surface connection pad 56.

This second semiconductor construct 51 has a planar square shape, and has a size set to be smaller than that of the other second semiconductor construct 41. This small second semiconductor construct 51 is installed on the connection pad portions of some of the second upper layer wiring lines 29 in a condition where its solder balls 57 are joined to the upper surface of the connection pad portions of the second upper layer wiring lines 29.

As shown in FIG. 1, the first semiconductor construct 2 is disposed on the center of the base plate 1, and the larger second semiconductor construct 41 is disposed on the upper side of the second upper layer insulating film 26 in a part corresponding to the left side of the first semiconductor construct 2. The small second semiconductor construct 51 is disposed on the upper side of the second upper layer insulating film 26 in a part corresponding to the right side of the first semiconductor construct 2.

Thus, in this semiconductor device, the second semiconductor constructs 41 and 51 are disposed in regions corresponding to the first semiconductor construct 2, such that thermal expansion and contraction of the insulating layer 21 provided on the periphery of the first semiconductor construct 2 do not have an adverse effect on the junction portions (the solder balls 44 and 57) of the second semiconductor constructs 41 and 51, and a difference of thermal expansion coefficients between the second semiconductor constructs 41 and 51 and the first semiconductor construct 2 can be narrowed down, and moreover, the damage due to the thermal stress in the junction portions of the second semiconductor constructs 41 and 51 can be prevented.

In the embodiment described above, the second semiconductor constructs 41 and 51 are installed in the regions corresponding to the parts of the first semiconductor construct 2, but this is not a limitation. In short, all that is required is that the junction portions for the connection pad portions of the second upper layer wiring line 29 achieved by the solder balls 44 and 57 of the second semiconductor constructs 41 and 51 are within the region where the first semiconductor construct 2 is disposed. It does not matter if the second semiconductor constructs 41 and 51 extend to some degree out of the region where the first semiconductor construct 2 is disposed.

Furthermore, the number of second semiconductor constructs may be one or three or more. The second semiconductor construct preferably has the same basic configuration as that of the first semiconductor construct 2, as the one second semiconductor construct 41. The reason is that the difference of thermal expansion coefficients between the second semiconductor constructs and the first semiconductor construct can be further narrowed down.

Still further, the first semiconductor construct is not limited to the CSP, and may be, for example, a bare chip such as the other second semiconductor construct 51. Moreover, the silicon substrate of the first semiconductor construct may be a simple substrate which does not have, on its upper surface, the integrated circuit with the predetermined function and the connection pad connected thereto. In this case, the first semiconductor construct may have a configuration wherein, for example, a thin film network of a resistor, a condenser, an inductor and the like is formed on a silicon substrate as a simple substrate, on which a wiring line, a columnar electrode and a sealing film are formed.

Further yet, in the embodiment described above, the second semiconductor constructs 41 and 51 are installed on the second upper layer wiring lines 29, and the solder balls 35 are provided under the lower layer wiring lines 32. On the contrary, the solder balls may be provided on the top of the upper layer wiring lines, and the second semiconductor constructs may be installed under the lower layer wiring lines. Alternatively, a wiring line and an external connection pad portion may be provided on the surface where the second semiconductor constructs are installed, and this external connection pad portion may be connected to another electronic component, in which case there is no need for a wiring line and an external connection pad portion on the other surface. Moreover, the upper layer wiring line and the lower layer wiring line may have one layer or two or more layers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:

a base plate;

a first semiconductor construct provided on an upper surface of the base plate and having a semiconductor substrate and a plurality of external connection electrodes provided on the semiconductor substrate;

an insulating layer provided on the base plate around the first semiconductor construct;

an upper layer insulating film provided on the first semiconductor construct and the insulating layer;

a plurality of upper layer wiring lines provided on the upper layer insulating film so that the upper layer wiring line is electrically connected to the external connection electrode of the first semiconductor construct; and at least one second semiconductor construct having jointing portions joined to connection pad portions of the upper layer wiring lines, wherein all the jointing portions of the second semiconductor construct for the connection pad portions of the upper layer wiring lines are disposed in a region corresponding to the first semiconductor construct.

2. The semiconductor device according to claim 1, wherein the second semiconductor construct is disposed in the region corresponding to the first semiconductor construct.

3. The semiconductor device according to claim 1, further comprising: a plurality of lower layer wiring lines provided on a lower surface of the base plate;

and a vertical conducting portion which is provided in a through-hole formed in the base plate, the insulating layer and the upper layer insulating film so that the upper layer wiring line is electrically connected to the lower layer wiring line.

4. The semiconductor device according to claim 1, wherein the semiconductor substrate has a plurality of connection pads formed thereon; and the first semiconductor construct includes a protection film having openings corresponding to the connection pads, a plurality of wiring lines provided on the protection film so that the wiring line is connected to the connection pad, the external connection electrodes provided on connection pad portions of the wiring lines, and a sealing film provided between the external connection electrodes on the protection film, the external connection electrodes being columnar.

5. The semiconductor device according to claim 4, wherein the second semiconductor construct comprises a semiconductor substrate having a plurality of connection pads, a protection film having openings corresponding to the connection pads, plurality of wiring lines provided on the protection film so that the wiring line is electrically connected to the connection pad, external connection electrodes provided on connection pad portions of the wiring lines, and a sealing film provided between the external connection electrodes on the protection film.

6. The semiconductor device according to claim 3, wherein a solder ball is provided under a connection pad portion of the lower layer wiring line.

7. The semiconductor device according to claim 1, wherein there is provided a plurality of second semiconductor constructs in which all jointing portions are disposed in the region corresponding to the first semiconductor construct.

8. A semiconductor device comprising: a substrate having an outer shape size; a first semiconductor construct having an outer shape size smaller than that of the substrate, having one surface carried on the substrate and having a plurality of external connection electrodes on the other surface opposite to said one surface; an insulating layer covering peripheral surface of the first semiconductor construct and the other surface; a plurality of vertical conducting portions provided through the substrate and the insulating layer; a wiring line connecting at least one of the vertical conducting portions and the external connection electrodes; and a second semiconductor construct having junction portions connected to connection pads of the wiring lines, wherein the junction portions of the second semiconductor construct are disposed in a region of the first semiconductor construct.

9. A semiconductor device comprising:

a first semiconductor construct including a semiconductor substrate having a plurality of connection pads formed thereon, a protection film having openings corresponding to the connection pads, a plurality of wiring lines provided on the protection film and connected to the connection pads, respectively, a plurality of columnar electrodes provided on connection pad portions of the wiring lines, and a sealing film provided between the columnar electrodes on the protection film;

a first wiring construct provided on one surface of the first semiconductor construct, the first wiring construct including a first insulating layer and a plurality of first wires carried on the first insulating layer;

a second wiring construct provided on the other surface opposite to the one surface of the first semiconductor construct, the second wiring construct including a second insulating layer and a plurality of second wires carried on the second insulating layer;

a vertical conducting portion which connects at least one of the first wires of the first wiring construct with one of the second wires of the second wiring construct; and a second semiconductor construct having jointing portions joined to connection pad portions of one of the first wires of the first wiring construct and the second wires of the second wiring construct;

wherein all the jointing portions of the second semiconductor construct bonded to the connection pad portions of one of the first wires of the first wiring construct and the second wires of the second wiring construct are disposed in a region corresponding to the first semiconductor construct.

* * * * *